United States Patent
Komatsuda et al.

(10) Patent No.: US 6,842,500 B1
(45) Date of Patent: Jan. 11, 2005

(54) EXPOSURE APPARATUS AND EXPOSURE METHOD USING SAME

(75) Inventors: Hideki Komatsuda, Kawasaki (JP); Hiroyuki Kondo, Tsukuba (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/396,582

(22) Filed: Sep. 15, 1999

(30) Foreign Application Priority Data

Sep. 17, 1998 (JP) .......................................... 10-263679

(51) Int. Cl.[7] .............................................. G21K 5/00
(52) U.S. Cl. .................................................... 378/34
(58) Field of Search ........................................... 378/34

(56) References Cited

U.S. PATENT DOCUMENTS

| 5,222,112 | A |   | 6/1993 | Terasawa et al. |       |
|-----------|---|---|--------|-----------------|-------|
| 5,606,586 | A | * | 2/1997 | Amemiya et al.  | 378/34 |
| 6,504,896 | B2| * | 1/2003 | Miyake et al.   | 378/34 |

FOREIGN PATENT DOCUMENTS

| JP | A-63-72116  | 4/1988  |
| JP | A-5-288696  | 11/1993 |
| JP | A-8-15499   | 1/1996  |

* cited by examiner

*Primary Examiner*—Craig E. Church
(74) *Attorney, Agent, or Firm*—Oliff & Berridge PLC

(57) ABSTRACT

An exposure apparatus (EA2) that uses X-ray radiation in a photolithographic process and can obtain various measurements regarding the X-ray radiation used, by obtaining and analyzing readings of the photoelectric effect on various reflective surfaces (5, 60a, 60b, 7, 7a, 9a, 9b, 9c and 9d) or optical elements (50a and 51). With the measurements of the X-ray radiation, the exposure apparatus can control the exposure dose during the mask (8) and wafer (10) illumination process. The exposure system also has the ability to detect deformation in the mirrors (9a, 9b, 9c and 9d) of the projection optical system caused by heat generated by absorption of the X-ray radiation. This is accomplished by analyzing the photoelectric effect occurring on the mirror surfaces and correcting the deformation of the mirrors based on this analysis.

43 Claims, 2 Drawing Sheets

EXPOSURE APPARATUS AND EXPOSURE METHOD USING SAME

FIELD OF INVENTION

The present invention relates to exposure apparatus that uses X-rays during a photolithographic process in the fabrication of semiconductor devices with high levels of integration, and more particularly such apparatus that uses soft X-rays and an exposure control method using same.

BACKGROUND OF THE INVENTION

To accurately and faithfully transfer or project a fine pattern of a mask onto a photosensitive substrate (wafer) with an exposure apparatus for manufacturing semiconductor devices by photolithography, it is essential to extract a portion of the exposure light (radiation) in the optical path between the light source that supplies the exposure light and the photosensitive substrate, and to perform various measurements on the extracted light.

In a conventional exposure apparatus, a light-dividing member such as a half mirror is positioned in the optical path between the light source and the photosensitive substrate. The light-dividing member then extracts a portion of the exposure light, which in turn, is detected by a photoelectric detector. Various measurements are conducted on this portion of the exposure light.

The fine pattern developed on the substrate during the photolithographic step, in particular, the pattern line width, must fall within a certain permissible values. To achieve the necessary values, the accuracy of the exposure time and illumination intensity (i.e., exposure dose) must be on the order of 1% or lower. Therefore, it is essential to have a mechanism that constantly measures, during the exposure operation, the exposure time and illumination intensity of the exposure light guided to the photosensitive substrate.

One measurement of diverted exposure light is used to control the exposure dose. The following, with the aid of the schematic diagram in FIG. 1, explains prior art exposure technique for controlling the exposure dose.

FIG. 1 shows a prior art exposure apparatus EA1. In FIG. 1, an exposure light beam BI is supplied from a light source 101, such as a KrF excimer laser that emits pulsed light of a 248 nm wavelength, or an ArF excimer laser that emits pulsed light of a 193 nm wavelength. Light beam B1 is shaped to a predetermined light beam cross-sectional pattern by a beam shaping optical system 102. Light beam B1 then enters a flyeye lens 104 which serves as an optical integrator, via a folding mirror 103. Numerous light source images (secondary light sources) S2 are formed by flyeye lens 104. The light beams (not shown) from numerous light source images S2 are condensed via a lens 106 and a condenser optical system 109. Condenser optical system 109 then superimposes the light beams and uniformly illuminates a mask 110.

When mask 110 is uniformly illuminated, the pattern image of the mask is projected and transferred onto a photosensitive substrate (wafer) 113 by a projection optical system 111.

An aperture stop 105 is provided on the exit side of flyeye lens 104, and an aperture stop 112 is provided in projection optical system 111 between a lens 11a and a lens 111b. In addition, a folding mirror 108 is provided between a lens 109a and a lens 109b in condenser optical system 109.

To measure the exposure dose, exposure apparatus EA1 uses reflected light amplitude-divided by a surface 107a of a half mirror 107. Half mirror 107 is arranged between lens 106 and lens 109a in condenser optical system 109 and directs the reflected amplitude-divided portion of the light thorough condenser lens 114, which condenses the reflected light. The light then strikes a photoelectric detector 115.

The light-receiving surface of photoelectric detector 115 is arranged optically conjugate to wafer 113. The change in the illumination intensity on photoelectric detector 115 is proportional, to a high degree of accuracy, to the change in illumination intensity on wafer 113. Consequently, the exposure time and illumination intensity are controlled with high precision by feeding the measurement results from photoelectric detector 115 to an exposure dose control apparatus (not shown) and then stopping the output from light source 101, or by cutting off the supply of exposure light by a cutoff means, such as a shutter (not shown) placed in light beam B1.

Another measurement technique using exposure apparatus EA1 corrects so-called irradiation fluctuations in projection optical system 111 caused by heat accumulated in the system. The optical characteristics of projection optical system 111 changes during use due to heat accumulated by the absorption of exposure light passing through the projection optical system.

This second technique uses a second condenser lens 116 and a second photoelectric detector 117 arranged in the direction of reflection on the reverse side of half mirror 107. Some of the exposure light is reflected by wafer 113 and travels back through the system via projection optical system 111, mask 110, lens 109b, folding mirror 108 and lens 109a. A portion of this light is reflected by a surface 107b of half mirror 107 through condenser lens 116. This light is then photoelectrically detected by second photoelectric detector 117.

Thus, the amount of change in the optical characteristics of projection optical system 111 is calculated using the output from photoelectric detector 115 obtained from light reflecting from surface 107a of half mirror 107 and comparing it to the output from second photoelectric detector 117 obtained from light reflecting from surface 107b of half mirror 107. Changes in optical characteristics of projection optical system 111 are corrected by changing the movement of the lenses or the pressure in projection optical system 111.

The relationship (condition (1)):

$$R \propto \lambda/NA \qquad (1)$$

defines the resolving power of projection optical system 111 in exposure apparatus EA1. Therein, R is the pitch of the pattern at the resolution limit formed on the photosensitive substrate, λ is the exposure wavelength, and NA is the numerical aperture of projection optical system 111.

As shown by condition (1) above, the shorter the exposure wavelength, the smaller the pitch of the pattern can be imaged at the resolution limit. Thus, to form finer patterns on the photosensitive substrate, it is desirable to perform exposure with exposure light having a wavelength as short as possible.

The shortest wavelengths presently being considered for photolithographic exposure apparatus is in a region called soft X-rays, which are on the order of 5 to 20 nm.

Optical materials that transmits soft X-rays in the 5 to 20 nm wavelength range do not exist. Thus, it is impossible to assemble an optical system using lenses to form an appropriate projection exposure apparatus. To assemble an appropriate projection optical system for a projection exposure apparatus to manipulate soft x-rays, one has to use a plurality of reflective mirrors having predetermined curvatures.

To accurately and faithfully transfer a fine pattern of a mask onto a wafer, as discussed earlier, it is essential in an exposure apparatus that uses soft X-rays to extract a portion of the exposure radiation in the exposure optical path between the light source suppling the exposure light and the wafer, and to perform the necessary measurements on that extracted light. Use of a light dividing system such as a half mirror to extract one part of the exposure light in the exposure optical path is highly desirable.

For example, if a surface equivalent to the surface to be exposed (e.g., wafer 113), is formed on the light receiving surface of photoelectric detector 115 for the purpose of controlling the exposure dose, as discussed earlier, the exposure light beam must be amplitude-divided by a half mirror (e.g., half-mirror 107). Alternatively, if the exposure light beam is wavefront-divided using an optical member that wavefront-divides the exposure light-beam in place of a half mirror, a serious degradation in detection accuracy occurs. This problem arises because the part of the light beam guided to photoelectric detector 115 and the part of the light beam that reaches the surface to be exposed, are irradiated from light source luminescent spot regions at different locations, or are light beams irradiated from light source luminescent spot regions in different directions.

However, significant problems exist in fabricating a half mirror that can amplitude-divide electromagnetic radiation beam having a wavelength in the soft X-ray region.

Thus, what is needed is an optical member for soft X-rays which has the same effect as a half mirror that amplitude-divides a light beam in the visible or near visible range, an apparatus which can detect the intensity and the like of soft X-ray exposure light or electromagnetic radiation, and an apparatus that can perform various measurements for controlling the exposure process to achieve optimal exposure results.

SUMMARY OF THE INVENTION

It is a goal of the present invention, in view of the above problem, to provide, without using an optical member like a half mirror that amplitude-divides a light or radiation beam, an exposure apparatus and method that can detect the intensity of exposure of radiation having a wavelength in the soft X-ray region, that can perform various measurements on the same and thereby control the timing and intensity of illumination, i.e. the exposure dose, during a photolithographic process.

It is another goal of the present invention to provide a method and apparatus that can detect changes in the projection optical system of an exposure apparatus which indicate a degradation or deterioration of the alignment of the projection optical system and that corrects for such degradation and misalignment.

Accordingly, a first aspect of the invention is an exposure apparatus for exposing with X-rays a pattern present on a mask onto a photosensitive substrate. The apparatus comprises an optical system having a plurality of reflective surfaces. These surfaces are arranged so as to guide the X-rays to the mask and to transfer the mask pattern onto the photosensitive substrate. The apparatus further includes a detection apparatus arranged adjacent one of the reflective surfaces. The detection apparatus is designed to detect photoelectrically generated electrons from the one of the reflective surfaces when the one of the reflective surfaces is irradiated with the X-rays, and to provide a first output signal corresponding to an amount of the photoelectrically generated electrons detected.

A second aspect of the invention is an exposure apparatus as described above, further including an X-ray limiting apparatus and an exposure dose calculation apparatus. The latter is electrically connected to the detection apparatus and calculates, based on the first output signal, an exposure dose of the X-rays at the mask. The exposure dose calculation apparatus also generates a second output signal corresponding to the calculated exposure dose. The X-ray limiting apparatus is electrically connected to the exposure dose calculation apparatus, and controls the illumination of the X-rays based on the second output signal.

A third aspect of the invention is a method for controlling a radiation exposure dose in a photolithographic process. The method comprises the steps of first monitoring photoelectrically generated electrons from at least one reflective surface of a plurality of reflective surfaces used during a photolithographic exposure process, then determining from this monitoring (e.g., through analyzing the information obtained) if the exposure dose meets one or more predefined parameters, and then stopping the radiation exposure when the exposure dose meets the one or more predefined parameters.

DETAILED DESCRIPTION OF THE INVENTION

The present invention relates to exposure apparatus that uses X-rays during a photolithographic process in the fabrication of semiconductor devices with high levels of integration, and more particularly such apparatus that uses soft X-rays and an exposure control method using same.

If a material surface is irradiated with radiation, electrons are ejected from the surface due to the photoelectric effect. When this occurs, the maximum kinetic energy $E_{MAX}$ of the electrons is expressed by condition (2) below:

$$E_{MAX}=h\nu-w \quad (2)$$

Therein, h is Planck's constant, v is the frequency of the radiation, and w is a work function.

The photoelectric effect in condition (2) above is produced under the condition of hv>w. However, if the material surface that produces the photoelectric effect is metal, then work function w is several electron-volts, which is equivalent to several hundred nanometers when converted to a wavelength.

Accordingly, the photoelectric effect can be reliably obtained even with radiation having a wavelength in the soft X-ray region on the order of 5 to 20 nm.

Based on the above, various measurements can be conducted by measuring the photoelectric effect related to a thin film and the like formed on the reflective surface of a mirror and similar devices which make up the optical system of an exposure apparatus, even without using a radiation dividing member like a half mirror.

Accordingly, a reflective film of a mirror used for soft X-rays can be constructed with a multilayered film of a conductor or semiconductor (e.g., molybdenum or silicon and the like), and various measurements can be obtained by measuring the photoelectric effect generated by the mirror surface.

For example, by electrically connecting the reflective surface (reflective film) to ground via an ammeter or voltmeter, the portion of electrons lost by the photoelectric effect generated (i.e., photoelectrically generated electrons) at the reflective surface (reflective film), due to irradiation by soft X-rays, flow into the reflective surface (reflective film) towards ground. Consequently, various measurements can be conducted of the current or voltage generated at this point in time by detection of the electron flow (current) with an ammeter or the voltage differential with a voltmeter.

Figure 1:
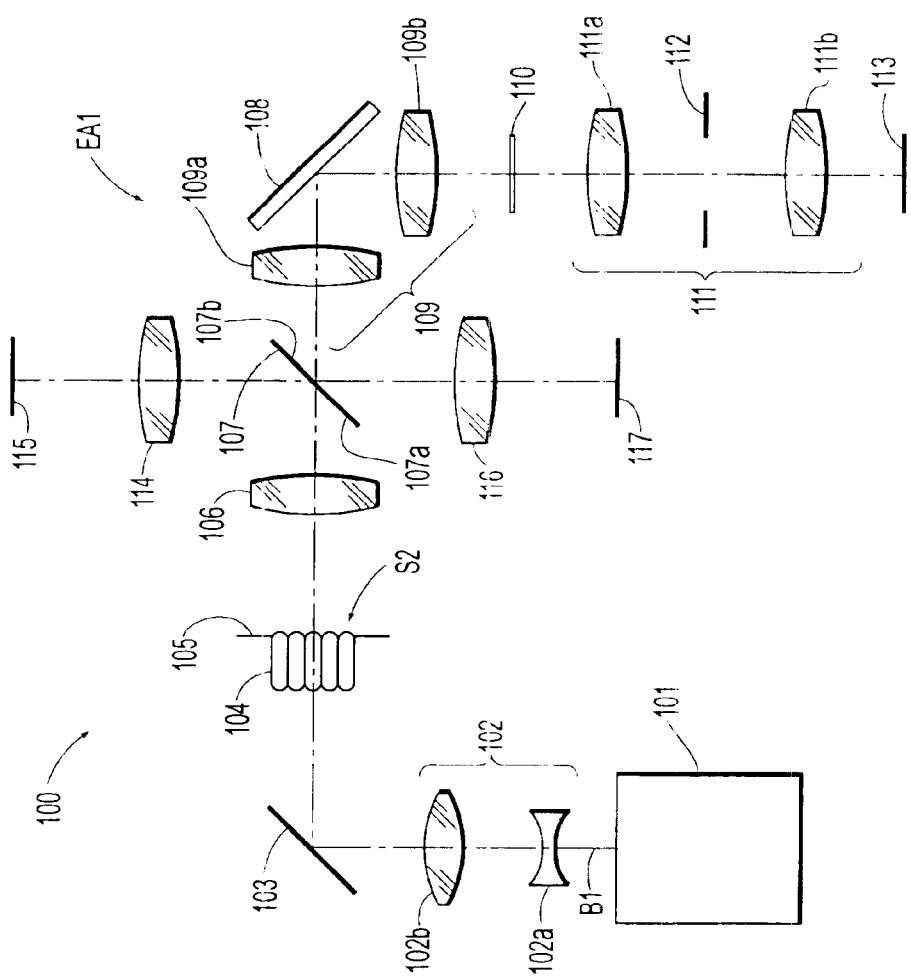
FIG. 1 is a schematic of a conventional prior art exposure apparatus.
Figure 2:
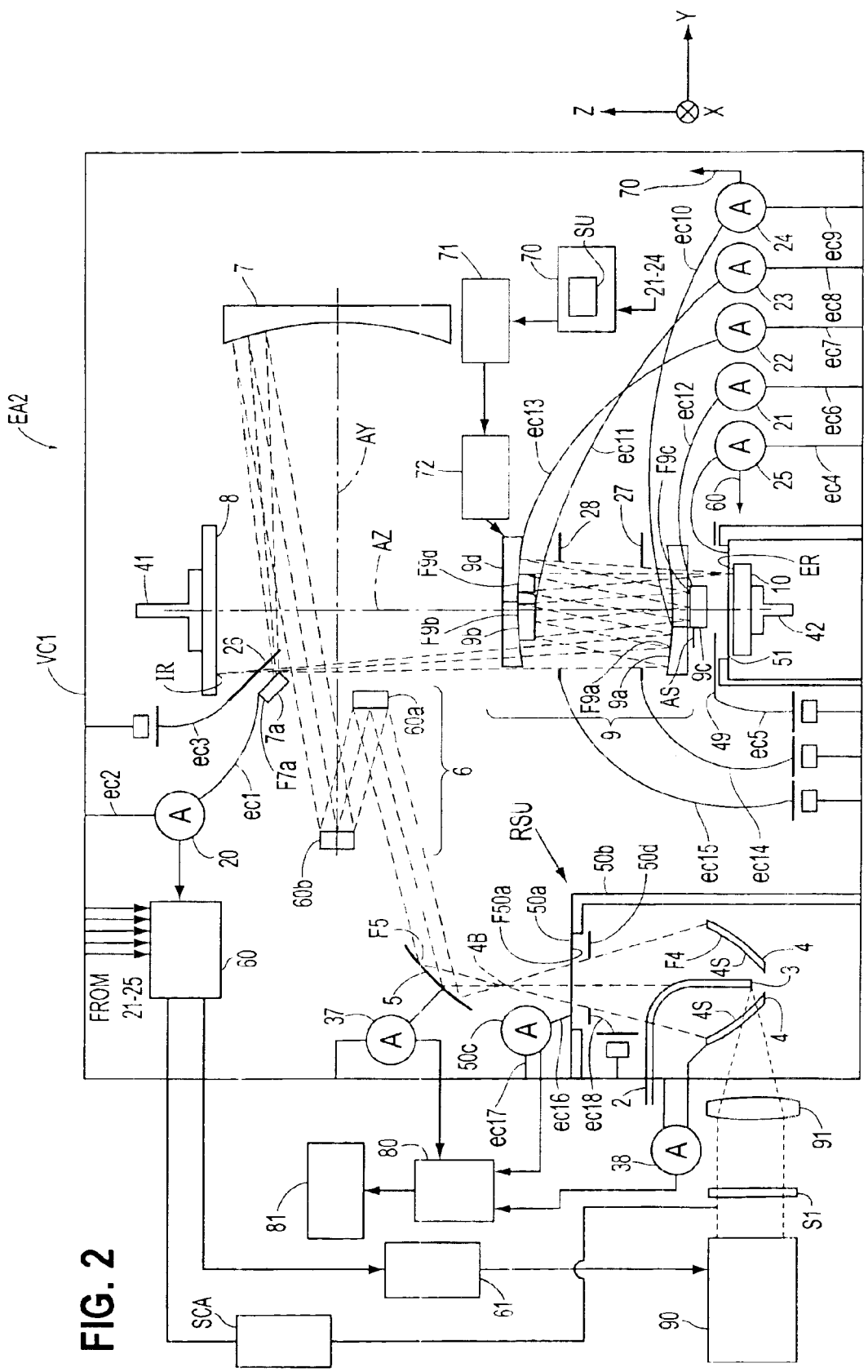
FIG. 2 is a schematic optical diagram of an exposure apparatus of the present invention.

Accordingly, the following explains an exposure apparatus according to a preferred embodiment for carrying out the present invention, as depicted in FIG. 2.

FIG. 2 schematically illustrates the overall construction of an exposure apparatus EA2 according to a preferred embodiment for carrying out the present invention. A projection exposure 9 therein uses radiation in the soft X-ray region having a wavelength on the order of 5 to 15 nm (EUV radiation) as the illumination light (i.e., electromagnetic radiation) for exposure, and performs the exposure operation by a step-and-scan method. In FIG. 2, the Z direction is the optical axis AZ direction of projection optical system 9 that forms a reduced image of a catoptric (reflective) mask 8 onto a wafer 10, the Y direction is a direction orthogonal to the Z direction and inside the paper plane, and the X direction is a direction orthogonal to the Y and Z directions and perpendicular to the paper plane.

Exposure apparatus EA2 transfers by a step-and-scan method the entire circuit pattern of catoptric mask 8 onto each of a plurality of exposure regions ER on wafer 10. It does so by scanning mask 8 and wafer 10 in a one-dimensional direction (herein, the Y-axis direction) relative to projection optical system 9 and projects sequentially, the image of one part of a circuit pattern (not shown) drawn on catoptric mask 8 onto wafer 10 via projection optical system 9.

Since soft X-rays, which are the illumination radiation or light for exposure in the present invention, have low transmittance with respect to the atmosphere, the optical path through which the soft X-rays pass is isolated from outside air by enclosing it within vacuum chamber VC1.

First, the illumination system according to the current mode for carrying out the present invention will be explained.

A laser light source 90 supplies laser light having a wavelength in a range from the infrared region to the visible region. In the present example, a semiconductor laser, YAG laser or excimer laser can be used as light source 90. The laser light generated by source 90 is directed towards a condenser optical system 91 which in turn directs it to position 3. A nozzle 2 jets gaseous matter toward position 3, and this jetted matter is in turn subjected to the laser light of high illumination intensity which has been projected to position 3 by condenser lens 91. At this point, the jetted matter rises in temperature due to the energy of the laser light until it is excited to a plasma state, at which point it discharges EUV radiation when it transitions to a low potential state.

An elliptical mirror 4 with an inner surface 4S, which functions as a condenser optical system, is arranged around position 3 such that the first focal point of elliptical mirror 4 substantially coincides with position 3. Inner surface 4S of elliptical mirror 4 has a multilayered film to reflect EUV radiation. The EUV radiation reflected thereby first converges at the second focal point 4B of elliptical mirror 4 and then proceeds to a parabolic mirror 5, a collimating reflective mirror. Parabolic mirror 5 is positioned so that its focal point substantially coincides with the second focal point 4B of elliptical mirror 4. The inner surface of mirror 5 also has a multilayered film F5 for reflecting EUV radiation.

The substantially collimated EUV radiation emitted from parabolic mirror 5 proceeds to catoptric flyeye optical system 6 which functions as an optical integrator. Catoptric flyeye optical system 6 comprises first catoptric element group 60a that integrates a plurality of reflective surfaces (plurality of mirror elements), and second catoptric element group 60b having a plurality of reflective surfaces corresponding to the plurality of reflective surfaces of first catoptric element group 60a. A multilayered film for reflecting EUV radiation is also provided on the plurality of reflective surfaces on the first and second catoptric element groups 60a and 60b.

The wavefront of the EUV radiation collimated by parabolic mirror 5 is divided by first catoptric element group 60a, and the EUV radiation from each of these reflective surfaces is converged to form a plurality of radiation source images (not shown). The plurality of reflective surfaces of second catoptric element group 60b is positioned in the vicinity of the position wherein this plurality of radiation source images is formed. This plurality of reflective surfaces of second catoptric element group 60b substantially serves the function of a field mirror. Thus, catoptric flyeye optical system 6 forms a plurality of radiation source images as secondary radiation sources using the approximately parallel radiation beam from parabolic mirror S. This type of catoptric flyeye optical system 6 is proposed in Japanese Patent Application Hei 10-47400, filed by the present applicant.

The EUV radiation from the secondary radiation sources formed by catoptric flyeye optical system 6 proceeds to a condenser mirror 7 positioned so that its focal point position is at the vicinity of the position of these secondary radiation sources, namely catoptric flyeye optical system 6. The light directed towards mirror 7 is reflected and condensed by condenser mirror 7, and then arrives on catoptric mask 8 via folding mirror 7a. A multilayered film that reflects EUV radiation is provided on the surfaces of condenser mirror 7 and folding mirror 7a. Furthermore, condenser mirror 7 converges the EUV light emitted from the secondary radiation sources, and superimposes this light so as to and uniformly illuminate a predetermined illumination region IR on catoptric mask 8.

In the preferred embodiment of the present invention, to spatially separate the optical path of the illumination radiation that proceeds to catoptric mask 8 and the optical path of the EUV radiation reflected by catoptric mask 8 and that proceeds to projection optical system 9, the illumination system is made a non-telecentric system. Also, projection optical system 9 is also made non-telecentric on the mask 8 side.

A reflective film comprising a multilayered film that reflects EUV radiation is provided on catoptric mask 8. This reflective film forms a pattern in accordance with the shape of the pattern to be transferred onto the photosensitive substrate of wafer 10. The EUV radiation, when reflected by catoptric mask 8 enters projection optical system 9 includes the pattern information of catoptric mask 8.

Projection optical system 9 according to the present mode for carrying out the present invention comprises a total of four mirrors: a concave first mirror 9a, a convex second mirror 9b, a convex third mirror 9c and a concave fourth mirror 9d. Multilayered film F9a–F9d that reflect EUV radiation are provided respectively on the reflective surfaces of mirrors 9a to 9d. Mirrors 9a to 9d are arranged so that their respective optical axes are coaxial.

A cutout is provided in first mirror 9a, second mirror 9b and fourth mirror 9d so as not to block the round-trip optical path formed by each of the mirrors 9a to 9d. In addition, an aperture stop AS (not shown) is provided at the position of third mirror 9c.

The EUV radiation reflected by catoptric mask 8 is sequentially reflected by first mirror 9a to fourth mirror 9d, and forms a reduced image of the pattern of catoptric mask 8 with predetermined reduction magnification β (for example, |β|=¼, ⅕, ⅙) in exposure region ER on wafer 10. Projection optical system 9 is constructed to be imagewise telecentric.

In exposure apparatus EA2, catoptric mask 8 is supported by a reticle (mask) stage 41 moveable at least along the Y direction. Wafer 10 is supported by a wafer stage (substrate stage) 42 moveable along the X, Y and Z directions. When performing the exposure operation, the illumination region IR on catoptric mask 8 is irradiated with EUV radiation by the illumination system, and catoptric mask 8 and wafer 10 are moved with respect to projection optical system 9 at a predetermined speed ratio prescribed by the reduction magnification of the projection optical system. Thereby, the pattern of catoptric mask 8 is scanned and exposed in predetermined exposure regions ER onto wafer 10.

The reflective surface of each mirror discussed above is formed with a multilayered reflective film suitable for reflecting EUV radiation. This multilayered film is formed by layering a plurality of substances from among the following: molybdenum, ruthenium, rhodium, silicon and silicon oxides.

The following explains the configuration used for detecting and controlling the exposure dose. A reflective film (multilayered film) F7a, discussed earlier, is formed on the surface (reflective surface) of folding mirror 7a as the surface to be irradiated. A first ammeter 20, the detection apparatus for detecting the exposure dose, is electrically connected to reflective film F7a of folding mirror 7a via an electric cable ec1. In addition, ammeter 20 is electrically connected to vacuum chamber VC1 via an electric cable ec2, and ammeter 20 is thereby grounded. Mirror 7a is one of the preferred reflective surfaces for taking the readings with respect to mask 8 since it is the closest to the mask.

In addition, a positive electrode plate 26 (an electrode member), which has a predetermined voltage applied to it, is positioned opposite folding mirror 7a (the position closest to folding mirror 7a). Electrode plate 26 is also electrically connected to vacuum chamber VC1 via an electric cable ec3. Electrode plate 26 is thereby grounded in a state with a predetermined voltage applied to it.

A filter 51 is positioned between projection optical system 9 and wafer 10 to prevent the adhesion of contaminants on mirrors 9a to 9d of the projection optical system 9. The contaminants resulting from the scattering caused by the irradiation by EUV radiation of the resist coated on wafer 10 and gas emitted from the resist. Filter 51 is an electrically conductive optical element that exhibits the photoelectric effect. To adequately transmit EUV radiation, filter 51 is made of a thin silicon plate having a thickness generally on the order of 0.5 to 1 μm.

A second ammeter 25 acts as the detection apparatus for detecting the exposure dose and is electrically connected to the surface of filter 51 via an electric cable. In addition, ammeter 25 is electrically connected to vacuum chamber VC1 via an electric cable ec4 thereby grounding ammeter 25.

A positive electrode plate 49, to which a predetermined voltage is applied, is arranged at a position opposite filter 51. Electrode plate 49 is electrically connected to vacuum chamber VC1 via an electric cable ec5. Electrode plate 49 provided at a position opposite filter 51 is thereby grounded in a state wherein a predetermined voltage is applied.

If reflective film F7a of surface 7a of folding mirror 7 is irradiated by EUV radiation, electrons are ejected from the reflective film due to the photoelectric effect. These ejected electrons are received at positive electrode plate 26. Ammeter 20 will thereby indicate an electric current value corresponding to the amount of radiation energy incident the reflective film.

Since folding mirror 7a is provided at the position closest to catoptric mask 8, the electric current value detected by ammeter 20 can be taken as an amount of radiation energy substantially corresponding to that irradiating the surface of catoptric mask 8. The detection apparatus for detecting the exposure dose of catoptric mask 8 comprises ammeter 20, which is grounded, and electrode plate 26 arranged opposite thereto and wherein a predetermined voltage is applied.

Additionally, filter 51 is located at the position closest to wafer 10, the surface to be irradiated. Consequently, when wafer 10 is irradiated, filter 51 is also irradiated by the same EUV radiation, which results in electrons being ejected from the surface of filter 51 due to the photoelectric effect. The electrons from filter 51 are then received at positive electrode plate 49 arranged at a position opposite filter 51. Ammeter 25 thereby indicates an electric current value corresponding to the amount of radiation energy incident filter 51 by the EUV radiation.

Therefore, since filter 51 is located at the position closest to wafer 10, the electric current value detected by ammeter 25 will substantially correspond to the radiation (electromagnetic energy) irradiating the surface of wafer 10. As noted above, ammeter 25, the detection apparatus for detecting the exposure dose affecting the photosensitive surface of wafer 10, is grounded and has positioned opposite it electrode plate 49 with a predetermined voltage applied thereto.

As described above, the exposure quantities applied to mask 8 and wafer 10 then correspond to electric current values detected by ammeter 20 and ammeter 25. In turn, ammeter 20 and ammeter 25 input their respective readings to an exposure dose calculation apparatus 60 in real time during an exposure operation via an output signal. Exposure dose calculation apparatus 60 then calculates the cumulative exposure dose required for exposure from the amount of EUV radiation energy incident mask 8. The information resulting from the calculation of the cumulative exposure dose calculated by exposure dose calculation apparatus 60 is then input via an output signal to X-ray output adjustment apparatus 61 electrically connected thereto as an X-ray limiting apparatus. X-ray output adjustment apparatus 61 stops the supply of laser light output from laser light source 90 via an output signal provided thereto.

The desired exposure dose can thus be applied to mask 8 and wafer 10 by the above described method and apparatus. In other words, the output of laser light source 90 can be adjusted so that the exposure dose at each expose region ER on wafer 10 is fixed (i.e., the quantity of radiation energy supplied per unit of time is constant) during the exposure operation in a step-and-scan exposure, as discussed above in relation to FIG. 2.

Exposure apparatus EA2 can be configured such that X-ray output adjustment apparatus 61 is the X-ray limiting apparatus which shuts off the output of laser light source 90. Another possibility is to position a shutter S1 at some point in the optical path between laser light source 90 and catoptric flyeye optical system 6 to block the light beam. Shutter S1 is electrically connected to a shutter control apparatus SCA which controls the drive of shutter S1 based on an output signal from exposure dose calculation apparatus 60, which is electrically connected to the shutter control apparatus.

In exposure apparatus EA2, the amount of radiation energy corresponding to that on the irradiation surface of catoptric mask 8 is detected by ammeter 20. The amount of radiation energy corresponding to that on the irradiation surface of wafer 10 is detected by ammeter 25. However, the amount of radiation energy corresponding to that on either irradiation surface (mask 8 or wafer 10) can also be detected by any one of ammeters 20 to 25 having electrical cables ec4, and ec6–ec9, respectively, connecting the ammeters to ground. Thus, the amount of cumulative exposure on the irradiation surface of catoptric mask 8 or wafer 10 can be calculated by exposure dose calculation apparatus 60 based on the reading from any one of ammeters 20 to 25.

Exposure apparatus EA2 includes positive electrode plates 26 and 49 opposite each of optical members 7a and 51, respectively, for measuring the exposure dose. However, radiation energy can be detected by ammeters 20 and 25 without positive electrode plates 26 and 49. Additionally, the above example describes a case wherein an ammeter is used as the detection apparatus for detecting the exposure dose. However, a voltmeter or the like may also be used.

Exposure apparatus EA2 provides an example in which the photoelectric effect is measured at the reflective surfaces of optical members 7a and 51 located at a position closest to the surfaces to be irradiated, respectively mask 8 and wafer 10. However, the photoelectric effect at reflective mirrors 5, 60a, 60b, 7, 9a to 9d or even filter 50a located at a positions remote from the surfaces to be irradiated can also be connected to an appropriate detection apparatus, such as an ammeter or volt meter. The readings taken can then be used for measuring the exposure dose.

The following describes the configuration and method of the system for controlling the optical characteristics of projection optical system 9 used to account for the effect of accumulated heat and the like caused by the absorption of EUV radiation.

Projection optical system 9 has four reflective mirrors 9a to 9d, as mentioned earlier. Also as discussed earlier, multilayered films form F9a–F9d the reflective film on the respective surfaces of each of reflective mirrors 9a to 9d.

Ammeter 24 is electrically connected to a reflective film F9a (multilayered film) of reflective mirror 9a via an electric cable ec10. Ammeter 24 is also electrically connected to vacuum chamber VC1 via electric cable ec9, and is thereby grounded. Ammeter 24 as configured acts as a detection apparatus for to detect the amount of radiation energy incident reflective mirror 9a.

Ammeter 23 is electrically connected to reflective film F9b (multilayered film) of reflective mirror 9b via an electric cable ec11. Ammeter 23 is also electrically connected to vacuum chamber VC1 via electric cable ec8, and is thereby grounded. Ammeter 23 as configured acts as a detection apparatus that detects the amount of radiation energy incident reflective mirror 9b.

Ammeter 21 is electrically connected to reflective film F9c (multilayered film) of reflective mirror 9b via an electric cable ec12. Ammeter 21 is also electrically connected to vacuum chamber VC1 via electric cable ec6, and is thereby grounded. Ammeter 21 as configured acts as a detection apparatus that detects the amount of radiation energy incident reflective mirror 9c.

Ammeter 22 is electrically connected to reflective film F9d (multilayered film) of reflective mirror 9d via an electric cable ec13. Ammeter 22 is also electrically connected to vacuum chamber VC1 via an electric cable ec7, and is thereby grounded. Ammeter 22 as configured acts as a detection apparatus that detects the amount of radiation energy incident reflective mirror 9d.

A positive electrode plate 27 (an electrode member) is positioned inside projection optical system 9 at a position opposite the reflective surfaces of reflective mirrors 9a, 9c. Electrode plate 27 also connects electrically to vacuum chamber VC1 via an electric cable ec14. Thus, a predetermined voltage can be applied to electrode plate 27 and maintained at a predetermined voltage state.

A positive electrode plate 28 (an electrode member) is arranged inside projection optical system 9 at a position opposite the reflective surfaces of the two reflective mirrors 9b, 9d. Electrode plate 28 electrically connects to vacuum chamber VC1 via an electric cable ec15. Thus, a predetermined voltage can be applied to electrode plate 28 and maintained at a predetermined voltage state.

Consequently, using the above configuration, EUV radiation is incident each of reflective mirrors 9a to 9d in projection optical system 9. Electrons are then ejected from reflective films F9a–F9d of reflective mirrors 9a to 9d, respectively, due to the photoelectric effect. Positive electrode plate 27, arranged opposite reflective mirrors 9a and 9c, captures electrons ejected from reflective films F9a, F9c of reflective mirrors 9a, 9c. Ammeters 21, 24 thereby indicate electric current values corresponding to the amount of EUV radiation energy incident each reflective mirror 9a, 9c, respectively.

At the same time, the electrons ejected from reflective films F9b, F9d of remaining two reflective mirrors 9b, 9d are captured by positive electrode plate 28 arranged opposite thereto. Ammeters 22 and 23 likewise indicate electric current values corresponding to the amount of EUV radiation energy incident each reflective mirror 9b, 9d.

The information represented by each of the electric current values detected by ammeters 21 to 24 (the amount of radiation energy applied to each of the reflective mirrors 9a to 9d), is input to a correction quantity calculation apparatus 70, electrically connected to ammeters 21-24, in real time during the exposure operation. A storage unit SU inside correction quantity calculation apparatus 70 pre-stores the relative relationship between the amount of irradiation and the deformation related to each of reflective mirrors 9a to 9d of projection optical system 9. Thus, correction quantity calculation apparatus 70 can calculate the amount of deformation in each of mirrors 9a to 9d using the output (output signals) from four ammeters 21 to 24, and comparing it to pre-stored information in storage unit SU. The information pre-stored in storage unit SU can be based on measurement data empirically-derived or on calculated data based on simulation.

Next, the information related to the amount of deformation in each of reflective mirrors 9a to 9d is calculated by correction quantity calculation apparatus 70. Alternatively, the output signal of deformation quantity calculation apparatus 70 is input to an adjustment quantity calculation apparatus 71 electrically connected thereto to correct the optical characteristics of projection optical system 9 that have deteriorated due to deformation in each mirror caused by the radiation. Adjustment quantity calculation apparatus 71 calculates the amount of correction necessary (the amount of movement of each of the reflective mirrors in the X, Y or Z direction, or the amount of inclination of each of reflective mirrors 9a–9d) for each of the reflective mirrors 9a to 9d based on the output signal from deformation quantity calculation apparatus 70.

Next, the output signal from adjustment quantity calculation apparatus 71, for the purpose of correction, is inputted to a drive apparatus 72 (the adjustment apparatus) electrically connected thereto. Drive apparatus 72 then uses the output from adjustment quantity calculation apparatus 71 to move each of reflective mirrors 9a to 9d in an appropriate direction or incline by just an appropriate amount of inclination and return them to the appropriate settings.

As described above, drive apparatus 72 enables the appropriate corrections to be made to the optical characteristics (magnification errors, aberrations and the like) of projection optical system 9, caused by the irradiation by EUV radiation, during the exposure operation. It does so by resetting each of reflective mirrors 9a to 9d to an appropriate position upon receipt of an input (e.g., an output signal from quantity calculation apparatus 71) indicating a problem.

Exposure apparatus EA2 calculates the amount of deformation in all of the reflective mirrors 9a to 9d based on the amount of radiation energy incident all reflective mirrors 9a to 9d that constitute projection optical system 9. However, exposure apparatus EA2 can also be configured such that it only detects the radiation energy incident reflective mirrors in projection optical system 9 that typically suffer marked or substantial deformation due to irradiation by EUV radiation. In this arrangement, only one of the mirrors of projection optical system 9 is moved or inclined to correct for the amount of fluctuation in radiation passing through the projection optical system.

In exposure apparatus EA2, positive electrode plates 27 and 28 are provided at positions opposite each of the reflective mirrors 9a to 9d of projection optical system 9. However, the amount of radiation energy can be detected by ammeters 21 to 24 without positive electrode plates 27 and 28. The preceding example that corrects fluctuations due to irradiation in projection optical system 9 uses an ammeter as the detection apparatus to detect the exposure dose. However, a voltmeter and the like may also be used.

The following describes the apparatus and method used by the present invention to detect the deterioration of optical characteristics which results from contamination of optical members by the EUV irradiation.

Use of the laser plasma radiation source unit comprising elements 90, 91, 2 and 3 creates a problem in that the spray of fine matter required by the process generates debris capable of contaminating elements in exposure apparatus EA2. If the elements become contaminated by the fine spray from nozzle 3, optical performance (mirror reflectance and reflection uniformity) deteriorates markedly. Consequently, a filter 50a protects the elements in exposure apparatus EA2 by only transmitting soft X-rays. Filter 50a prevents the transmission of sprayed particles generated, in the area of radiation source unit 90, 91, 2, and 3, into the main body unit of exposure apparatus A2. Filter 50a consists of an electrically conductive optical element that reacts by generating a photoelectric effect on the passage of EUV radiation. To assure adequate transmission of EUV radiation, filter 50a in the preferred embodiment is made of a thin silicon plate having a thickness, for example, on the order of 0.5 to 1 $\mu$m. Filter 50a is supported by electrical insulator member 50b.

Furthermore, as will be discussed in detail below, an ammeter 50c acts as a detection apparatus for detecting the state of contamination (deterioration in optical characteristics) of filter 50a. Ammeter 50c is electrically connected to the surface of filter 50a via an electric cable ec16. Ammeter 50c is also electrically connected to vacuum chamber VC1 via an electric cable ec17 and is thereby grounded.

In addition, positive electrode plate 50d, which has a predetermined voltage applied to it, is located at a position opposite filter 50a, a position which is closest to filter 50a. Electrode plate 50d electrically connects to vacuum chamber VC1 via an electric cable ec18 which grounds electrode plate 50d. Additionally a voltage can be applied to electrode plate 50d to maintain it in a specific potential state.

When filter 50a is irradiated with EUV radiation, electrons are ejected from a reflective film FSOa of filter 50a as a result of the photoelectric effect of the EUV radiation. The electrons are received by positive electrode plate 50d and ammeter 50c thereby indicates the electric current value corresponding to the amount of EUV radiation energy.

Since the fine matter spray of debris produced in the production of EUV radiation in the vicinity of position 3 adheres to everything, it has a tendency to contaminate filter 50a and elliptical mirror 4. The electric current value detected by ammeter 50c will change with the passage of time in accordance with the degree of contamination of elliptical mirror 4 and filter 50a. Consequently, the information related to decreases in the photoelectric effect due to the degree of contamination of filter 50a and elliptical mirror 4 are included in the electric current value detected by ammeter 50c.

The information related to the electric current value detected by ammeter 50c is input into a detection apparatus 80, which then detects the deterioration in optical characteristics caused by the state of contamination of filter 50a and elliptical mirror 4. If detector 80 determines that filter 50a and elliptical mirror 4 have become contaminated to such a degree that their optical characteristics have deteriorated to an impermissible level, i.e. it has fallen below a certain threshold level, then a message is displayed via display apparatus 81, such as a CRT monitor electrically connected thereto, indicating the need to service or replace filter 50a and elliptical mirror 4.

Thus, exposure apparatus EA2 has the added advantage of allowing one to ascertain when optical parts like filter 50a, elliptical mirror 4 and lens 91 should be serviced or replaced.

To more accurately detect the state of contamination (state of deterioration in optical characteristics) of filter 50a, it is preferable to include a detection apparatus, like an ammeter 37, that detects the photoelectric effect at a reflective film F5 of parabolic mirror 5. The output (output signal) from detection apparatus 37 is sent to detection apparatus 80 electrically connected thereto. Detection apparatus 80 can detect the state of contamination (state of deterioration in optical characteristics) of filter 50a based on the photoelectric effect at the reflective film of parabolic mirror 5.

The preceding examples describe a number of ways detection apparatus 80 can detect contamination of filter 50a and the resulting deterioration in its optical characteristics. The present invention is not limited to the preceding examples and may be configured with other detection apparatus, like an ammeter 38 that detects the photoelectric effect at reflective film F4 of elliptical mirror 4. Ammeter 38 detects the change in the reflectance of reflective film F4 of elliptical mirror 4 as the contamination of the reflective film causes a deterioration in optical characteristics of mirror 4. However, in the present invention, the preferred way to detect contamination of reflective film 4F and the corresponding deterioration in its optical characteristics is via ammeter 50c. As noted above, detection apparatus 50c connects to the surface of filter 50a, wherein it obtains readings based on the photoelectric effect at the surface and inputs the reading to detection apparatus 80. The contamination of the reflective film of elliptical mirror 4 (deterioration in optical characteristics) can thereby be more accurately detected.

In the description above, positive electrode plate 50d located opposite filter 50a is discussed as part of a method and apparatus for detecting contamination at filter 50a. However, the amount of radiation energy at the surface of filter 50a can be detected with only ammeter 50c without positive electrode plate 50d. Additionally, although the previous examples use an ammeter in the process of detecting contamination of filter 50a, a voltmeter and the like may be used instead.

The apparatus and methods described are not limited to detection of contamination of filter 50a, and can just as easily be used to detect contamination and degradation of optical characteristics of filter 51 adjacent to wafer 10, or to any other filter or mirror.

Additionally, characteristics such as the reflectance of catoptric optical members, the reflective mirrors of the projection apparatus etc., may deteriorate with the passage of time due to long-term exposure to irradiation. Accordingly, the system may be configured to include the necessary apparatus and methods for detecting of such deterioration. Such an apparatus and method would rely on changes indicated by monitoring the photoelectric effect on each of the reflective surfaces to determination if and when degradation and deterioration in the optical characteristics of the reflectance of the reflective surfaces of these catoptric optical members occur. Since such changes in the reflectance of each mirror can be monitored over the passage of time, an appropriate determination can be made as to when each mirror should be serviced or replaced.

The EUV radiation source unit RSU (which includes elements 90, 91, 2 to 5) that supplies EUV radiation to catoptric flyeye optical system 6 in exposure apparatus EA2 preferably is enclosed in a large housing (not shown). Thus, there is a possibility that it will equal or exceed the size of the exposure apparatus EA2 main body unit, comprising the optical system from by catoptric flyeye optical system 6 to wafer 10, and the control system. Accordingly, radiation source unit RSU and exposure apparatus main body unit may each have their own housing units. In this case, correctly aligning these two units and protecting them from exterior vibrations during operation becomes a critical factor. Even small vibrations, such as footsteps on the floor adjacent these units, can cause a misalignment of the optical axes of the two units.

Accordingly, it is preferable to include a detection apparatus that can photoelectrically detect an optical axis displacement between radiation source unit RSU and the exposure apparatus main body unit. Additionally, a method and apparatus for realigning the two units must be included. To this end, exposure apparatus EA2 preferably includes the additional capability of detecting changes in the position of the EUV radiation entering at catoptric flyeye optical system 6, such changes in the position of the EUV radiation corresponding to misalignment of the optical axis of both the EUV radiation source unit and exposure apparatus EA2. In a preferred embodiment, one or both of the elements 60a and 60b are configured to detect such changes based on the changes in the photoelectric effect which would result from such misalignment. In a preferred embodiment, collimating mirror 5 is made adjustable so that it can correct for the optical axis misalignment of the two units and by being properly adjusted correct for the misalignment.

While the present invention has been described in connection with a preferred embodiment, it will be understood that it is not so limited. On the contrary, it is intended to cover all alternatives, modifications and equivalents as may be included within the spirit and scope of the invention as defined in the appended claims.

What is claimed is:

1. An exposure apparatus for exposing with X-rays a pattern present on a mask onto a photosensitive substrate, comprising:

a. an optical system having a plurality of reflective surfaces arranged in an optical path to receive the X-rays so as to guide the X-rays to the mask and to transfer the mask pattern onto the photosensitive substrate, b. a detection apparatus electrically connected to at least one of the reflective surfaces and designed to detect photoelectrically generated electrons from the at least one of the reflective surfaces when the at least one of the reflective surfaces is irradiated with the X-rays, and to provide a first output signal corresponding to an amount of the photoelectrically generated electrons detected;

c. an exposure dose calculation apparatus, electrically connected to the detection apparatus, for calculating based on the first output signal, an exposure dose of the X-rays at the mask and capable of generating a second output signal corresponding to the exposure dose; and d. an X-ray limiting apparatus electrically connected to the exposure dose calculation apparatus, for controlling the illumination of the X-rays based on the second output signal.

2. An exposure apparatus for exposing with X-rays a pattern present on a mask onto a photosensitive substrate, comprising:

a. an optical system having a plurality of reflective surfaces arranged in an optical path to receive the X-rays so as to guide the X-rays to the mask and to transfer the mask pattern onto the photosensitive substrate;

b. a detection apparatus electrically connected to at least one of the reflective surfaces and designed to detect photoelectrically generated electrons from the at least one of the reflective surfaces when the at least one of the reflective surfaces is irradiated with the X-rays, and to provide a first output signal corresponding to an amount of the photoelectrically generated electrons detected;

c. an exposure dose calculation apparatus, electrically connected to the detection apparatus, for calculating based on the first output signal, an exposure dose of the X-rays at the photosensitive substrate and capable of generating a second output signal corresponding to the exposure dose; and d. an X-ray limiting apparatus electrically connected to the exposure dose calculation apparatus, for controlling the illumination of the X-rays based on the second output signal.

3. An exposure apparatus comprising:

a. an X-ray radiation source that generates X-rays;

b. an optical system disposed in an optical path to receive the X-rays and that guides the X-rays to a mask having a pattern, and then to a photosensitive substrate so as to form on the photosensitive substrate the pattern of the mask, the optical system including a plurality of optical elements, at least one of the optical elements exhibits a photoelectric effect upon irradiation by the X-rays;

c. a detection apparatus arranged relative to the at least one of the optical elements so as to detect photoelectrically generated electrons from the at least one of the optical elements, and which provides a first output signal corresponding to an amount of the photoelectrically generated electrons detected;

d. an exposure dose calculation apparatus electrically connected to the detection apparatus, that calculates an exposure dose of X-rays at the mask based on the first output signal, and generates a second output signal corresponding to the calculated exposure dose; and e. an X-ray limiting apparatus that limits the guidance of X-rays to the mask based on the second output signal.

4. An exposure apparatus comprising:

a. an X-ray radiation source that generates X-rays;

b. an optical system disposed in an optical path to receive the X-rays and that guides the X-rays to a mask having a pattern, and then to a photosensitive substrate so as to form on the photosensitive substrate the pattern of the mask, the optical system including a plurality of optical elements, at least one of the optical elements exhibits a photoelectric effect upon irradiation by the X-rays;

c. a detection apparatus arranged relative to the at least one of the optical elements so as to detect photoelectrically generated electrons from the at least one of the optical elements, and which provides a first output signal corresponding to an amount of the photoelectrically generated electrons detected;

d. an exposure dose calculation apparatus, electrically connected to the detection apparatus, for calculating, based on the output signal, an exposure dose of the X-rays at the photosensitive substrate and for generating a second output signal corresponding thereto; and e. an X-ray limiting apparatus electrically connected to the exposure dose calculation apparatus, for controlling the illumination of the X-rays based on the second output signal.

5. A method for controlling radiation exposure dose in a photolithographic process comprising the steps of a. monitoring photoelectrically generated electrons from at least one reflective surface of a plurality of reflective surfaces in relative alignment used during a photolithographic exposure process;

b. determining from said monitoring if the exposure dose meets one or more predefined parameters, and c. stopping the radiation exposure when the exposure dose meets said one or more predefined parameters.

6. An exposure dose control method of claim 5, further comprising the steps of:

a. determining from said monitoring if loss of alignment in said plurality of reflective surfaces is occurring; and b. adjusting a position of at least one of said reflective surfaces to realign said plurality of reflective surfaces.

7. The exposure control method of claim 5, wherein said monitoring is conducted during an X-ray radiation exposure process.

8. A method for controlling radiation exposure dose in a photolithographic process comprising the steps of:

a. monitoring photoelectrically generated electrons from at least one optical element of a plurality of optical elements used during a photolithographic exposure process;

b. determining from said monitoring if the exposure dose meets one or more predefined parameters; and c. stopping the radiation exposure when the exposure dose meets said one or more predefined parameters.

9. The exposure control method of claim 8, wherein said monitoring is conducted during an X-ray radiation exposure process.

10. A method for manufacturing a semiconductor device, comprising:

guiding X-rays to a mask with a pattern by using an optical system, the optical system including a plurality of reflective surfaces that form an illumination field onto the mask;

detecting photoelectrically generated electrons from at least one of the reflective surfaces when the at least one of the reflective surfaces is irradiated with the X-rays;

transferring the mask pattern onto a photosensitive substrate;

obtaining a change of a characteristic that is necessary to perform the transferring step, based on a detecting information from the detecting step;

calculating an exposure dose based on obtaining information from the obtaining step; and controlling the exposure dose based on a calculating information from the calculating step.

11. An illumination apparatus, comprising:

an illumination system which includes at least two optical members so as to guide radiation having a predetermined wavelength to an object to be irradiated;

a signal generator that is electrically connected to the at least two optical members and that generates electrical information based on a photoelectric effect which is caused by the radiation being irradiated to the at least two optical members; and a detector that is electrically connected to the signal generator and that detects an optical characteristic or a deterioration of an optical characteristic with respect to at least one of the at least two optical members based on the electrical information generated by the signal generator, wherein the detector detects an optical characteristic or a deterioration of an optical characteristic with respect to one of the optical members based on the electrical information generated by the signal generator for more than one of the optical members so that influences of the more than one optical members on the photoelectric effect caused at the one optical member can be taken into account in detecting the optical characteristic or the deterioration of the optical characteristic of the one optical member.

12. An illumination apparatus according to claim 11, wherein at least one of the at least two optical members includes a reflective member.

13. An illumination apparatus according to claim 11, wherein the signal generator includes one of a grounded ammeter and a voltmeter.

14. An illumination apparatus according to claim 11, wherein the signal generator includes electrode members having a positive electric potential respectively arranged in correspondence to each of the at least two optical members, and the electrode members are arranged in a vicinity of a corresponding one of the optical members.

15. An illumination apparatus according to claim 11, further comprising:

a radiation source which supplies 5 nm–20 nm radiation as the radiation having the predetermined wavelength.

16. An exposure apparatus which exposes a pattern of a mask onto a photosensitive substrate, comprising:

an illumination system which includes at least two optical members so as to guide radiation having a predetermined wavelength to the mask;

a signal generator that is electrically connected to the at least two optical members and that generates electrical information based on a photoelectric effect which is caused by the radiation being irradiated to the at least two optical members; and a detector that is electrically connected to the signal generator and that detects an optical characteristic and a deterioration of an optical characteristic with respect to at least one of the at least two optical members based on the electrical information generated by the signal generator, wherein the detector detects an optical characteristic and a deterioration of an optical characteristic with respect to one of the optical members based on the electrical information generated by the signal generator for more than one of the optical members so that influences of the more than one optical members on the photoelectric effect caused at the one optical member can be taken into account in detecting the optical characteristic and the deterioration of the optical characteristic of the one optical member.

17. An exposure apparatus according to claim 16, wherein at least one of the at least two optical members includes a reflective member.

18. An exposure apparatus according to claim 16, wherein the signal generator includes one of a grounded ammeter and a voltmeter.

19. An exposure apparatus according to claim 16, wherein the signal generator includes electrode members having a positive electric potential respectively arranged in correspondence to each of the at least two optical members, and the electrode members are arranged in a vicinity of a corresponding one of the optical members.

20. An exposure apparatus according to claim 16, further comprising:

a projection system which includes a plurality of reflective members in order to project an image of the pattern of the mask onto the photosensitive substrate.

21. An exposure method using the exposure apparatus as set forth in claim 20, comprising:

illuminating the mask by using the illumination system; and projecting the pattern of the mask onto the photosensitive substrate by using the projection system.

22. An illumination apparatus according to claim 16, further comprising:

a radiation source which supplies 5 nm–20 nm radiation as the radiation having the predetermined wavelength.

23. An exposure apparatus, comprising:

an exposure optical system which includes a projection system which projects an image of a pattern of a mask onto a photosensitive substrate in order to expose the pattern of the mask onto the photosensitive substrate by illuminating the mask with radiation having a predetermined wavelength;

a signal generator that is electrically connected to at least one reflective member among a plurality of reflective members that are provided in the exposure optical system and that generates electrical information based on a photoelectric effect which is caused by the radiation being irradiated onto the at least one reflective member;

a calculation device that is electrically connected to the signal generator and that calculates an amount of correction of an optical characteristic of the projection system based on the electrical information generated by the signal generator; and an adjusting device that is electrically connected to the calculation device and that adjusts the optical characteristic of the projection system based on the calculated amount of correction.

24. An exposure apparatus according to claim 23, wherein the calculation device includes a first calculation unit that calculates an amount of deformation of at least one reflective member of the projection system, and a second calculation unit that calculates an amount of adjustment according to the calculation result of the first calculation unit.

25. An exposure apparatus according to claim 23, wherein:

the projection system includes a plurality of the reflective members; and the adjusting device adjusts at least one of the plurality of reflective members of the projection system.

26. An exposure apparatus according to claim 23, wherein the signal generator generates the electrical information from at least one reflective member of the plurality of reflective members of the projection system.

27. An exposure apparatus according to claim 23, wherein the signal generator includes one of a grounded ammeter and a voltmeter.

28. An exposure apparatus according to claim 23, wherein the signal generator includes an electrode member having a positive electric potential that is arranged in a vicinity of the at least one reflective member among the plurality of reflective members.

29. An exposure apparatus according to claim 23, further comprising:

a radiation source which supplies 5 nm–20 nm radiation as the radiation having the predetermined wavelength.

30. An exposure method using the exposure apparatus as set forth in claim 23, comprising:

illuminating the radiation having the predetermined wavelength onto the mask; and projecting the image of the pattern of the mask onto the photosensitive substrate by using the projection system.

31. An exposure apparatus, comprising:

an illumination system that illuminates radiation having a predetermined wavelength onto a mask;

a projection system that includes a plurality of reflective members so as to project an image of a pattern of the mask onto a photosensitive substrate;

a signal generator that is electrically connected to at least one reflective member among the plurality of reflective members and that generates electrical information based on a photoelectric effect which is caused by the radiation being irradiated to the at least one reflective member;

a calculation device that is electrically connected to the signal generator and that calculates an amount of correction of an optical characteristic of the projection system based on the electrical information generated by the signal generator; and an adjusting device that is electrically connected to the calculation device and that adjusts the optical characteristic of the projection system based on the calculated amount of correction.

32. An exposure apparatus according to claim 31, wherein the calculation device includes a first calculation unit that calculates an amount of deformation of at least one reflective member of the projection system, and a second calculation unit that calculates an amount of adjustment from the calculation result of the first calculation unit.

33. An exposure apparatus according to claim 31, wherein the adjusting device adjusts at least one of the plurality of reflective members of the projection system.

34. An exposure apparatus according to claim 31, wherein the signal generator includes one of a grounded ammeter and a voltmeter.

35. An exposure apparatus according to claim 31, further comprising:

a radiation source which supplies 5 nm–20 nm radiation as the radiation having the predetermined wavelength.

36. An exposure method using the exposure apparatus as set forth in claim 31, comprising:

illuminating the mask by using the illumination system; and projecting the pattern of the mask onto the photosensitive substrate by using the projection system.

37. An exposure apparatus, comprising:

a radiation source that supplies radiation having a predetermined wavelength;

an exposure optical system which includes a plurality of optical members so as to expose a pattern of the mask onto a photosensitive substrate by illuminating the radiation having the predetermined wavelength onto the mask;

a signal generator that is electrically connected to at least one optical member among the plurality of optical members and that generates electrical information based on a photoelectric effect which is caused by the radiation being irradiated to the at least one optical member; and a controller that is electrically connected to the signal generator and that performs a predetermined control based on the electrical information generated by the signal generator.

38. An exposure apparatus according to claim 37, wherein the controller controls at least one of a characteristic of radiation from the radiation source, an exposure characteristic in an exposure region formed on the photosensitive substrate, and an optical characteristic in the exposure region formed on the photosensitive substrate.

39. An exposure apparatus according to claim 37, wherein the controller includes a calculation device that is electrically connected to the signal generator and that calculates an amount of exposure based on the radiation having the predetermined wavelength, and an adjusting device that is electrically connected to the calculation device and that adjusts an output of the radiation source based on the output from the calculation device.

40. An exposure apparatus according to claim 37, wherein the controller includes:

a calculation device that is electrically connected to the signal generator and that calculates an amount of correction of an optical characteristic of the exposure optical system based on the electrical information generated by the signal generator; and an adjusting device that is electrically connected to the calculation device and that adjusts the optical characteristic of the exposure optical system based on the calculated amount of correction.

41. An exposure apparatus according to claim 40, wherein the calculation device includes a first calculation unit that calculates an amount of deformation of at least one reflective member of the exposure optical system, and a second calculation unit that calculates an amount of change according to the calculation result of the first calculation unit.

42. An exposure apparatus according to claim 37, wherein the radiation source supplies 5 nm–20 nm radiation as the radiation having the predetermined wavelength.

43. An exposure method using the exposure apparatus as set forth in claim 37, comprising:

illuminating the mask by using an illumination system of the exposure optical system; and projecting a pattern of the mask onto the photosensitive substrate by using a projection system of the exposure optical system.

* * * * *